United States Patent [19]
Yero et al.

[11] Patent Number: 5,406,141
[45] Date of Patent: Apr. 11, 1995

[54] HIGH VOLTAGE CMOS SWITCHING CIRCUIT

[75] Inventors: Emilio Yero; Olivier Rouy, both of Aix-en-Provence, France

[73] Assignee: SGS-Thomson Microelectronics, S.A., Gentilly Cedex, France

[21] Appl. No.: 88,544

[22] Filed: Jul. 6, 1993

[30] Foreign Application Priority Data

Jul. 6, 1992 [FR] France .................. 92 08332

[51] Int. Cl.$^6$ .................. H03K 19/0175; H03K 3/01
[52] U.S. Cl. ..................... 326/68; 326/121; 327/108; 327/210
[58] Field of Search ............... 307/475, 465, 270, 451, 307/279

[56] References Cited

U.S. PATENT DOCUMENTS

| | | | |
|---|---|---|---|
| 4,039,862 | 8/1977 | Dingwall et al. | 307/475 |
| 4,161,663 | 7/1979 | Martinez | 307/475 |
| 4,724,343 | 2/1988 | LeRoux et al. | 307/279 |
| 4,845,381 | 7/1989 | Cuevas | 307/451 |
| 4,920,284 | 4/1990 | Denda | 307/475 |
| 4,996,443 | 2/1991 | Tateno | 307/475 |
| 5,191,233 | 3/1993 | Nakano | 307/279 |
| 5,243,236 | 9/1993 | McDaniel | 307/451 |
| 5,266,848 | 11/1993 | Nakagome et al. | 307/475 |

FOREIGN PATENT DOCUMENTS

62001185 1/1987 Japan .

OTHER PUBLICATIONS

Concannon, et al., "FET Current Driver Having Large Dynamic Range", IBM Technical Disclosure Bulletin, vol. 25, No. 7A, Dec. 1982, p. 3505.

IBM Technical Disclosure Bulletin, vol. 32, No. 7, Dec. 1989, "5-Volt Signal Level Shifter in a 3-Volt CMOS Circuit", p. 454.

Primary Examiner—Edward P. Westin
Assistant Examiner—Richard Roseen
Attorney, Agent, or Firm—Robert Groover; Betty Formby

[57] ABSTRACT

A high-voltage switching circuit comprising two arms, wherein each arm has a P-channel load transistor, a forward biased diode and an N-channel switching transistor series-connected between the high voltage and the ground. The gate of the N-channel transistor is controlled by a switching signal C in one arm and by the complementary switching signal C/ in the other arm. Such a structure enables the stress undergone by the load and switching transistors of the switching circuit to be reduced by several magnitudes.

27 Claims, 2 Drawing Sheets

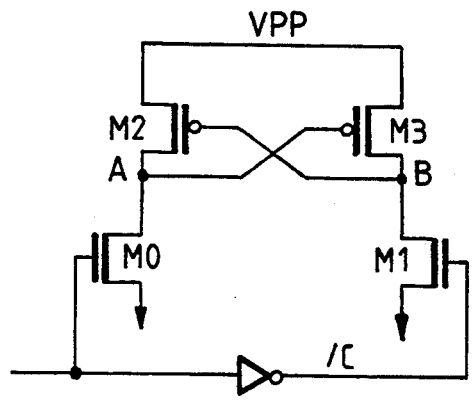
FIG_1
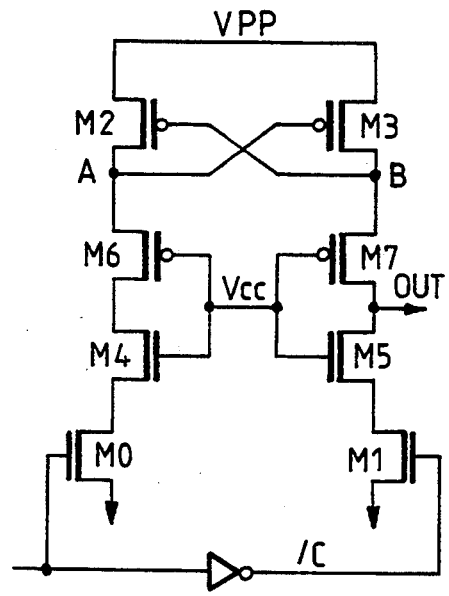
FIG_2
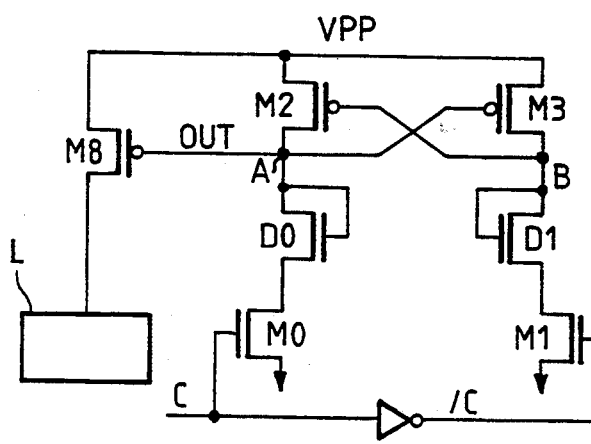
FIG_3
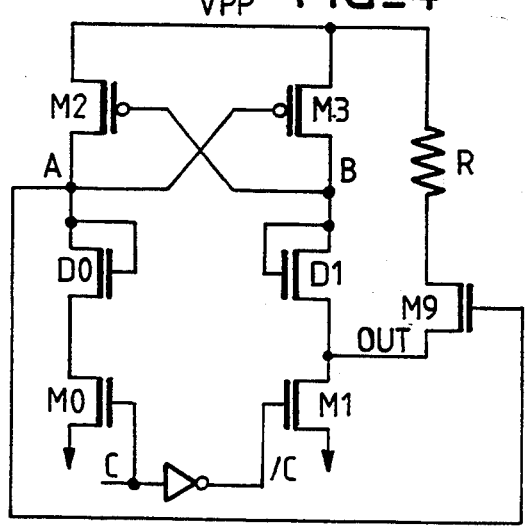
FIG_4
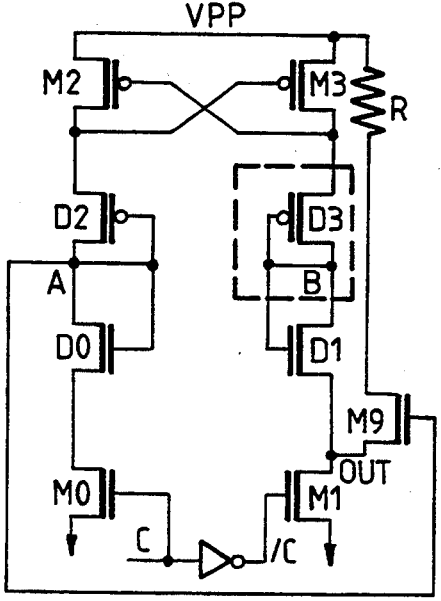
FIG_5

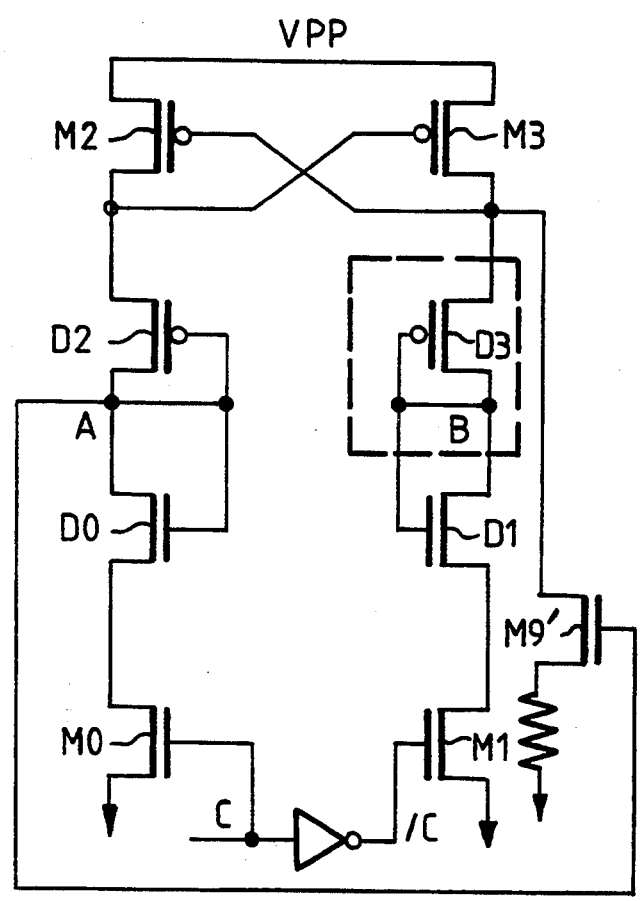
FIG_6

HIGH VOLTAGE CMOS SWITCHING CIRCUIT

CROSS-REFERENCE TO RELATED APPLICATION

This application claims priority from French App'n 92-08332, filed Jul. 6, 1992, which is hereby incorporated by reference.

BACKGROUND AND SUMMARY OF THE INVENTION

This invention relates to integrated circuits which include switching for high voltages, and particularly to programmable integrated circuits which include switching for a high programming voltage $V_{PP}$.

In an integrated circuit, it is often necessary to use voltage levels that are higher than the nominal logic levels of the circuit. For example, in a normal memory circuit, the logic signals are typically 5-volt logic signals, but for programming it is necessary to have a high voltage $V_{PP}$ on the order of 12 volts.

However, a potential difference of 12V across a normal gate oxide can cause enough stress to degrade the oxide over the lifetime of the part and cause reliability problems. In order to protect against this degradation, it is necessary to reduce the voltage drop by distributing it over several transistors.

What is needed therefore is a circuitry which, upon a 5-volt logic control signal, will translate this signal into a 12-volt logic control signal and switch it over at output to a load circuit.

Such a circuit is shown in FIG. 1. In a standard way, it comprises two arms. Each arm has an N type switching transistor (M0, M1 respectively) and a P type controlled load transistor (M2, M3 respectively), series-connected between the ground and the high voltage $V_{PP}$. The N type transistor of one arm is controlled at its gate by a switching signal C, and the N type transistor of the other arm is controlled at its gate by the complementary switching signal C\. The P type transistor of each arm has its gate controlled by the connection point between the P type transistor and the N type transistor of the other arm.

In this way, in taking as an output one of the connection points between the P type transistor and the N type transistor of one of the arms, there is obtained, at output, a zero volt level or the level $V_{PP}$, for example 12 volts. A circuit of this kind works as follows: when the switching signal C is at 5 volts, the N type transistor M0, which then has its gate potential at 5 volts and has its source connected to the ground, is on. The N type transistor M1, the gate potential of which, fixed by the complementary switching signal C\, is then equal to 0 volts, is off. The transistor M0 therefore takes the potential of its drain towards 0 volts. The P type transistor M3, which is controlled at its gate by the drain of the transistor M0 and has its source connected to the high voltage $V_{PP}$, is off. Since the transistor M1 is off, the connection point B between the transistors M3 and M1 tends towards 12 volts. The P type transistor M2, which therefore receives a voltage close to 12 volts at its gate, is off. A state of equilibrium is then set up. The transistors M1 and M2 being off, the potential of the drain of the transistor M0 gets stabilized at 0 volt and the potential of the drain of the transistor M3 gets stabilized at $V_{PP}$.

When the switching signal C passes to 0 volts, the roles are reversed. At equilibrium, the connection point A between the transistors M0 and M2 will be at 12 volts and the connection point B between the transistors M1 and M3 will be at 0 volts.

With a circuit such as this, the drops in gate/drain, gate/source or drain/source voltage are very great. They are equal to the high voltage $V_{PP}$. The transistors are subjected to a stress which may prompt the deterioration of their gate oxide by an aging phenomenon, punchthrough between the drain and the source or the breakdown of the drain/substrate or well junctions and the source/substrate or well junctions. These phenomena are well known.

Since the stress undergone by transistors constitutes a major drawback, a standard system of protection used is that of a protective cascade mounting of the P type load transistors and another protective cascade mounting of the N type switching transistors as is shown in FIG. 2. In each arm, a P type protection transistor M6, M7 and an N type protection transistor M4, M5 are series-connected between the P type transistor M2, M3 and the N type transistor M0, M1 of the switching circuit. Their gates are connected to the nominal supply voltage $V_{CC}$ of the circuit: the N type protection transistors M4, M5 are thus cascade-connected to protect the N type switching transistors M0, M1 and the P type protection transistors are cascade-mounted to protect the P type load transistors M2, M3. These P type load transistors M2, M3 are each controlled at their gate by the connection point between the N type switching transistor and the P type protection transistor of the other arm. The output level OUT is taken between the P type transistor and the N type protection transistor of one of the arms. (In the example of FIG. 2, this is taken from between the transistors M5 and M7.)

The N type protection transistors M4 and M5, which have their gates at $V_{CC}$, prevent their sources from rising above the level $V_{CC}-V_{TN}$, otherwise they would no longer be on. The potential of the drain of the N type switching transistors M0, M1 therefore cannot rise above $V_{CC}-V_{TN}$, i.e. typically 4 volts.

The P type protection transistors M6 and M7, which have their gates at $V_{CC}$, prevent their sources from falling below $V_{CC}-V_{TP}$, otherwise they would no longer be on. The potential of the drain of the P type load transistors M2, M3 therefore cannot fall below $V_{CC}+V_{TP}$, i.e. typically 6 volts. Since the drain potential of one arm is applied to the gate of the P type load transistor of the other arm, the same is true of these gates.

Thus, depending on the level of the switching signal C, either 0 volt or $V_{PP}$ is switched to the output OUT, but the drop in gate/drain, gate/source or source/drain voltage of the different load and switching protection transistors is far below that of the above assembly (FIG. 1) since the drops in voltage are distributed among four transistors whereas they were initially distributed between only two transistors. In an assembly such as this, the two P type transistors of an arm are used for the switching of $V_{PP}$ while the two N type transistors of an arm are used for the switching of 0 volt.

Now, it is possible that the supply voltage $V_{CC}$ will not be applied during a certain period of time. Under these conditions, if the high voltage $V_{PP}$ is present, large voltage drops may occur at the terminals of the protection transistors of the cascade assemblies.

Indeed, if $V_{CC}=0$, the P type protection transistors have 0 volts at their gates and may have $V_{PP}$ at their sources. They are then conductive and transmit $V_{PP}$ to their drains: the N type protection transistors then have $V_{PP}$ at their drains while their gates are at 0 volts. The P type and N type protection transistors may therefore undergo major stress.

A new technique is therefore needed that will predictably prevent major stress to the P type and N type protection transistors. Such a means is provided herein.

The disclosed inventions solve this problem by using a different configuration. In the configuration of FIG. 2, the distribution of the voltage drops will make it possible, at equilibrium, to bring the voltage drops between gate and drain, gate and source or drain and source to 6 volts or less for normal levels of the voltages $V_{PP}$ and $V_{CC}$.

According to the invention, it is proposed to enforce a small plus or minus voltage drop at the drains of the P type transistors and N type transistors of each of the arms. In this way, the voltage drop between gate and drain, gate and source and drain and source is reduced. A reduction by 1 volt reduces the electrical field to an extent sufficient to reduce the stress by several orders of magnitude.

According to the invention, it is proposed to place a forward biased diode in series between the P type transistor and the N type switching transistor of each of the arms. Since the diode is forward biased, it imposes a voltage drop that is equal to its threshold voltage. Thus, a voltage drop is added in each arm. For example, at the drain of the P type transistor of one of the arms, there will be a potential that is equal to the threshold voltage of the diode and no longer equal to 0 volt. At the drain of the N type transistor, there will be a potential $V_{PP}$ minus the threshold voltage of the diode. The protection device cannot be used to switch 0 volt or $V_{PP}$ to one and the same output. The effect of the drop in voltage due to the diode is passed on to one of the switched voltage levels.

According to an embodiment of the invention, the output OUT of the switching circuit is applied to the gate of a power transistor which will enable the application of the high voltage $V_{PP}$ to a load circuit.

According to another embodiment of the invention, the output OUT of the circuit is applied to the terminal of a resistor, the other terminal being connected to the high voltage. In this case, it is sought to switch the 0 volt and $V_{PP}$ levels to the output with very high precision.

According to the invention, then, it is proposed to interpose, between the resistor and the output OUT, an isolation transistor controlled at its gate by an output taken at the other arm of the switching circuit.

The output taken at the other arm between the P type transistor and the diode will enable the isolation transistor to be turned on or off and 0 volts or $V_{PP}$ to be applied to the terminals of the resistor.

According to another embodiment of the invention, a diode is placed between the output point, which controls the gate of the isolation transistor, and the P type transistor: the output which controls the gate is then between two diodes. The first diode increases the 0 volt level by the value of a threshold voltage, and the second diode reduces the $V_{PP}$ level by the value of a threshold voltage.

The invention therefore relates to a circuit for the switching of a high voltage $V_{PP}$. This circuit comprises two arms, each having a P type transistor and an N type transistor series-connected between the high voltage $V_{PP}$ and the ground. The P type transistor is controlled at its gate by the connection point between the P type transistor and the N type transistor of the other arm. The N type transistor of one arm is controlled at its gate by a switching signal and the N type transistor of the other arm is controlled at its gate by the complementary switching signal.

A diode is connected between the P type transistor and the N type transistor in each of the arms.

In an application for the control of a high-voltage transfer transistor, the output of the switch-over circuit is taken between the diode and the P type transistor of one of the arms, to control the gate of the transfer transistor.

In an application for the switching of high voltage over to a resistive load according to the invention, an isolation transistor is placed between a resistor and an output of the circuit given by an arm, and this selection transistor is controlled at its gate by an output taken at the other arm.

Advantageously, a diode is placed on this other arm, between the first diode and the P type transistor. In this way, the selection transistor associated with the resistor is itself protected from stress.

Thus, the disclosed innovations provide the advantage of reduced stress on the gate oxide due to $V_{PP}$ switching. If gate oxide stress is within acceptable limits, this advantage can also be translated, in some integrated circuits, to permit use of thinner gate oxides.

BRIEF DESCRIPTION OF THE DRAWING

The present invention will be described with reference to the accompanying drawings, which show important sample embodiments of the invention and which are incorporated in the specification hereof by reference, wherein:

FIG. 1 is a schematic diagram illustrating a switching circuit without protection;

FIG. 2 is a schematic diagram illustrating a switching circuit with a standard protection device;

FIG. 3 is a schematic diagram illustrating an embodiment of a switching circuit incorporating a high voltage protection device;

FIG. 4 is a schematic diagram illustrating another embodiment of a switching circuit incorporating a high voltage protection device;

FIG. 5 is a schematic diagram illustrating an additional high voltage protection device incorporated in the switching circuit of FIG. 4.

FIG. 6 is a schematic diagram illustrating an embodiment which is complementary to that shown in FIG. 5.

DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

FIGS. 1 and 2 have already been described. In FIGS. 3, 4 and 5, elements which have generally similar (even if not identical) functions are designated with the same reference characters as in FIGS. 1 and 2.

The switching circuit, in the embodiment of the invention shown in FIG. 3, has two arms. Each arm has a P type transistor (M2 and M3 respectively) series-connected with a forward biased diode (D0, D1 respectively), and an N type transistor (M0, M1 respectively). These two transistors and the diode are series-connected in each arm between the high voltage $V_{PP}$ and the ground. The sources of the transistors M2, M3 respectively are connected to the high voltage $V_{PP}$. The drain of the transistor M2, M3 respectively is connected to the anode of the diode D0, D1 respectively. The drains of the transistors M0, M1 respectively are connected to the cathode of the diode D0, D1 respectively. The sources of the transistors M0, M1 respectively are connected to ground.

In the first arm, the P type transistor M2 has its gate controlled by the connection point B between the transistor M3 and the diode D1 of the second arm. The N type transistor M0 has its gate controlled by the switching signal C. In the second arm, the P type transistor M3 has its gate controlled by the connection point A between the transistor M2 and the diode D0 of the first arm and the N type transistor M1 has its gate controlled by the complementary switching signal C\.

Since the diodes D0, D1 are forward biased, they impose a voltage drop, at their terminals, approximately equal to their threshold voltage: $V_{D0}$ for the diode D0, $V_{D1}$ for the diode D1.

When the switching voltage C is at 5 volts, the transistor M0 is on and the transistor M1 is off. At equilibrium, the transistor M0 conveys the potential of its drain to 0 volt, but the diode D0 imposes a voltage drop equal to its threshold voltage $V_{D0}$ at its terminals. At the connection point A between the diode D0 and the transistor M2, the voltage is then equal to this threshold voltage $V_{D0}$. In the second arm, the same phenomenon occurs: the diode D1 imposes a voltage drop at its terminals equal to its threshold voltage $V_{D1}$. Thus, at the connection point B between the diode D1 and the transistor M3, the voltage is equal to $V_{PP}$ at equilibrium since the transistor M3 is on. The potential of the drain of the transistor M1 is, for its part, equal to the voltage $V_{PP}$ minus the threshold voltage $V_{D1}$ of the diode D1. The working of the circuit, when the switching signal is at 0 volts, is easily deduced by symmetry.

In this embodiment of the switching circuit, the drop in gate/drain, gate/source or drain/source voltage of the transistors is $V_{PP}-V_{Di}$ at most, where $V_{Di}$ is the threshold voltage of a diode. The voltage drop has been reduced by the value of a diode threshold voltage. This makes it possible to prevent stress on the transistors of the switching circuit and the deterioration of their gate oxide. The diodes are not subjected to stress either.

In one example, with $V_{PP}=12$ volts, $V_{D0}=V_{D1}=1$ volt when the switching signal is at 5 volts, the transistor M0 has its source connected to the ground, its drain at 0 volts and its gate at 5 volts; the transistor M1 has its source connected to the ground, its drain at $V_{PP}-V_{D1}=11$ volts, its gate at 0 volts; the transistor M2 has its source at $V_{D0}=1$ volt, its drain at 12 volts and its gate at $V_{PP}-V_{D1}11$ volts; the transistor M3 has its source at 12 volts, its drain at 12 volts and its gate at $V_{D0}=1$ volt. The maximum voltage drop between the different electrodes is therefore equal to 11 volts, which makes it possible to prevent these transistors from being subjected to stress.

In an example shown in FIG. 3, the diodes are formed by N type or P type transistors, the gate of which is connected to the drain. For example, the diode D0 of the first arm is an N type transistor having its gate connected to its drain. Its drain is connected to the drain of the transistor M2 and its source is connected to the drain of the transistor M0. The diode threshold voltage is then increased by the substrate effect: the threshold voltage increases with the biasing of the source of the transistor. Thus, this substrate effect is advantageously used to further reduce the voltage drops at the switching and load transistors.

If the output signal OUT of the switching circuit that has just been described is taken at the connection point between the diode D1 and the P type transistor M3, the output OUT will take, as its value, either $V_{PP}$ or the threshold voltage $V_{D1}$ of the diode D1.

If the output OUT is taken at the connection point between the N type transistor M1 and the diode D1, then the output level will be equal to either 0 volts or $V_{PP}-V_{D1}$.

The circuit of the invention cannot be used to switch $V_{PP}$ and 0 to the same output. Depending on the output chosen, the output levels will be $V_{PP}-V_{Di}$ and 0 volts, or $V_{PP}$ and $V_{Di}$, $V_{Di}$ being the threshold voltage of a diode D1 (D0 or D1 depending on whether the output is taken at the first arm or the second arm).

In the case of the command for a transfer transistor to switch a high level of voltage $V_{PP}$ to a load, it is in fact necessary to have available only one full voltage level: $V_{PP}$ to turn off a P type transfer transistor or 0 volt to turn off an N type transfer transistor. Let us assume, as is shown in FIG. 3, that the output of the switching circuit controls the gate of a P type transfer transistor M8, having its source connected to the high voltage level $V_{PP}$ and its drain connected to a load circuit L, to which the high voltage has to be applied. What has to be done, in this case, is either to turn off the power transistor M8 and hence impose the full voltage level $V_{PP}$ on its gate or else to make the power transistor M8 highly conductive and impose, on its gate, a level that is close enough to 0 volt for it to let through a large amount of current. However, it is not necessary to apply 0 volt. It is enough to apply voltage of the order of 1 volt. By analogy, if the transfer transistor is an N type transistor, its drain being connected to the high voltage $V_{PP}$ and its source being connected to the load circuit L, 0 volt must be applied to its gate to turn it off, but the application of a voltage close to $V_{PP}$ is enough to make it highly conductive. It is noted that the P type transfer transistor can be used to transfer $V_{PP}$ to the load circuit, without losses, while the N type transistor can be used to transfer only $V_{PP}$ minus the threshold voltage of the transfer transistor.

The circuit described and shown in FIG. 3 is therefore well suited to controlling capacitive loads to switch a high voltage level. It is very simple and inexpensive to make. In particular, the diodes are formed by N type or P type transistors. This circuit enables the efficient protection of the N and P type transistors of the switching circuit.

Furthermore, it is not dependent on the nominal supply voltage $V_{CC}$ of the circuit, unlike in the prior art. The switching circuit according to the invention is thus rid of the problems related to the levels of voltage $V_{PP}$ and $V_{CC}$ with respect to each other. The switching circuit no longer depends on any factor other than the level of voltage $V_{PP}$. The requisite protection of the transistors of the circuit is thus obtained in every possible case, whether $V_{PP}$ is at the right level or not, and irrespectively of the state of $V_{CC}$.

The switching circuit that has just been described in this embodiment has a very high output impedance. Indeed, the transistors M2 and M3 have to be fairly resistive for the N type transistors to be capable of taking the potential of their drains to a level close to 0 volt. This switching circuit can therefore control only capacitive loads.

In many applications, there is also need to control high voltage levels on resistive loads, for example in an analog voltage generation circuit. The levels to be switched to must then be very precise. The values of voltage that must really be switched to are 0 volt and $V_{PP}$. It is not acceptable to switch $V_{PP}$ and $V_{Di}$ or $V_{PP}-V_{Di}$ and 0 volt. Indeed, these circuits use, as a parameter, the current that flows into the resistor. This current depends very greatly on the levels of voltage applied to the resistor.

Under these conditions, the switching circuit such as the one seen in FIG. 3 is not appropriate. For, if a resistor is series-connected between the level of high voltage $V_{PP}$ and an output of the switching circuit taken at the drain of a switching transistor, for example M1, when the switching signal C is equal to 5 volts, the transistor M1 is off. There is no current to be made to flow into the resistor. Since the drop in voltage is zero at the resistor, said resistor brings the high voltage $V_{PP}$ to the drain of the transistor M1: it is the resistive load which, in this case, subjects the switching transistor to stress. Similarly, if a resistor is series-connected between the ground and an output of the switching circuit taken at the drain of a load transistor, for example M3, when the switching signal is equal to 0 volt, the transistor M3 is off; there is no current to be made to flow into the resistor. Since the voltage drop is zero at the resistor, said resistor brings 0 volt to the drain of the transistor M3: it is the resistive load that subjects the load transistor to stress.

Furthermore, the switching circuit of FIG. 3 cannot switch 0 volt and $V_{PP}$ to one and the same output OUT: one of the levels is affected by a diode threshold voltage. And this diode threshold voltage is a parameter that varies with the methods and with the substrate effect and there may therefore be a degree of imprecision with respect to this parameter.

In the invention, there is proposed another embodiment of a switching circuit to enable the 0 volt or $V_{PP}$ to be switched to a resistive load. This embodiment is shown in FIG. 4.

According to the invention, an isolation transistor is series-connected between the resistor and the output OUT of the switching circuit taken on one arm. The gate of this transistor is controlled by an output taken on the other arm. In the example shown in FIG. 4, starting from the circuit of FIG. 3, an N type isolation transistor M9 is placed between a resistor R and the drain of the switching transistor M1. The other terminal of the resistor R is connected to the high voltage $V_{PP}$. The isolation transistor M9 has its gate connected to the connection point A between the diode D0 and the load transistor M2.

In the example chosen and shown in FIG. 4, when the switching signal C is at 5 volts, the switching transistor M0 is on and the switching transistor M1 is off. It has been seen, in this case, that the potential of the drain of the transistor M1 is equal to $V_{PP}-V_{D1}$. The potential of the gate of the isolation transistor M9, which is controlled by the connection point A between the load transistor M2 and the diode D0, is equal to the threshold voltage $V_{D0}$ of the diode D0.

The N type isolation transistor M9, which therefore has $V_{PP}-V_{D1}$ at its source and $V_{D0}$ at its gate, is not conductive. No current flows into the resistor R. The potential of the drain of the isolation transistor M9 is taken to $V_{PP}$.

When the switching signal C is at 0 volt, the transistor M1 is on and the transistor M0 is off. Since the transistor M0 is off, the potential at the connection point A between the diode D0 and the transistor M2 is at $V_{PP}$. $V_{PP}$ is therefore applied to the gate of the isolation transistor M9. The transistor M1 is on: the potential of its drain is at 0 volt. There is therefore 0 volt at the source of the isolation transistor M9 which is then highly conductive and takes the potential of its drain to 0 volt. The drop in voltage $V_{PP}$ is obtained to the full extent at the terminals of the resistor R.

When the switching signal C is at 0 volt, the isolation transistor M9 is not protected from stress: it has $V_{PP}$ at its gate, 0 volt at its source and 0 volt at its drain.

In an improvement, shown in FIG. 5, of the embodiment shown in FIG. 4, it is proposed to place a forward-biased diode D2 between the diode D0 and the load transistor M2 of the first arm and to take, as the control output of the gate of the isolation transistor M9, the connection point A between the two diodes D0 and D2. When the switching transistor M0 is on, the potential at the connection point A is equal to the threshold voltage $V_{D0}$ of the diode D0; and when the transistor M0 is off, since there is a voltage drop at the terminals of the diode D2 equal to its threshold voltage $V_{D2}$, the potential of the connection point A is no longer $V_{PP}$, but $V_{PP}-V_{D2}$. The voltage of the gate of the isolation transistor M9 is then either $V_{D0}$ or $V_{PP}-V_{D2}$, and there is then an isolation transistor protected from stress, whatever may be the voltage levels at its source and its drain.

It is easy to deduce the complementary solution for a resistor placed between the ground and the drain of a P type load transistor, for example M3. As shown in FIG. 6, the isolation transistor according to the invention will then be a P type transistor Mg1 and will be placed in series between the resistor and the drain of the load transistor M3 with its gate advantageously controlled by the connection point between the diode D0 and the diode D2, so as to reduce the stress to which it is subjected by several magnitudes.

The embodiment of the invention described and shown in FIG. 4, or its complementary solution shown in FIG. 6, therefore enables a resistive load R to be switched over fully to 0 volts or fully to $V_{PP}$, while at the same time protecting the different switching transistors of the switching circuit from stress and, in one improvement shown in FIG. 5, protecting the isolation transistor associated with the resistive load.

Preferably and advantageously, the switching circuit is made by means of CMOS technology. In this case, it is provided, for the two diodes D1 and D2 of the first branch, that one will be made out of an N type transistor and the other out of a P type transistor to have a symmetrical structure that is easy to make by CMOS technology. In the example shown in FIG. 5, a forward-biased diode D3, shown in dashes, is advantageously added between the diode D1 and the transistor M3 of the second arm of the switching circuit in order to obtain a perfectly symmetrical structure. There is then an additional voltage drop in the second arm, equal to the threshold voltage $V_{D3}$ of the diode D3. The drain of the transistor M1 will then be at a potential equal either to 0 volt or to $V_{PP}-V_{D1}-V_{D3}$.

In the example of FIG. 5, the diodes D2 and D3 are made with a P type transistor, the gate of which is connected to the drain. It must be noted that, should the diodes be formed by the N type or P type transistors, the threshold voltage of the diode is equal to a threshold voltage of the N type transistor for an N type transistor and to a threshold voltage of a P type transistor for a P type transistor.

In the depiction chosen for FIG. 5, the gate of the P type transistor M2 is controlled by the connection point placed between the diode D2, and the load transistor M2 and the gate of the transistor M2 is controlled by the connection point placed between the diode D3 and the load transistor M2. When the switching signal C is at 5 volts, the load transistor M2 has a potential $V_{PP}$ at its gate and the load transistor M3 has a potential $V_{D0}$ at its gate. When the switching signal C is at 0 volt, the transistor M2 has a potential $V_{D1}$ at its gate and the transistor M3 has a potential $V_{PP}$ at its gate.

For illustrative purposes only, an example of sample design dimensions, in the embodiment of FIG. 5, is as follows. Designers of ordinary skill will, of course, know how to vary them.

M0 W/L=15/1.4 μm;
M1 W/L=15/1.4 μm;
M2 W/L=10/5 μm;
M3 W/L=10/5 μm;
M9 W/L=15/1.4 μm;
D0 W/L=15/1.4 μm;
D1 W/L=15/1.4 μm;
D2 W/L=10/2 μm;
D3 W/L=10/2 μm;
$V_{TN}=V_{Tp}=900$ mV; gate oxide thickness=300 Å; value of resistor R=78 kΩ (much greater than the series resistance of M9 etc.)

It is quite possible in another embodiment (not shown) to control the gate of a load transistor of one arm, by the connection point between the two diodes of the other arm.

The switching circuit according to the invention can therefore be used to switch a high level of voltage $V_{PP}$ without causing any stress on the transistors of the switching circuit and without depending on the level taken by $V_{PP}$ or $V_{CC}$. It emerges therefrom that the programmable circuit into which this switching circuit is integrated is far better protected and far more reliable since there is no risk that the switching circuit will be damaged by poor supply to the circuit and by a defect in the supply sources.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. An integrated circuit configured to operate on first and second logic supply voltages, said second voltage being more positive than said first voltage, comprising:
   a high voltage switching circuit connected to receive a third voltage which is outside the range of said first and second voltages, and comprising two circuit arms each comprising:
      first and second field-effect transistors of opposite conductivity types, operatively connected in series between said first and third voltages;
      said first transistors of either arm each having a respective gate thereof connected to a drain of said first transistor in the other said arm;
      said second transistors of either arm having respective gates thereof connected to receive mutually complementary logic signals;
      wherein each said arm further comprises at least one protection diode interposed between said first and second transistors;
      and wherein one said arm is connected to provide an output node intermediate between said first and second transistors.

2. The integrated circuit of claim 1, further comprising a load resistance and an isolation transistor jointly series-connected between said third voltage and said second transistor of one said arm, said isolation transistor having the same conductivity type as said second transistors.

3. The integrated circuit of claim 1, wherein a drain terminal of one of said second transistors is directly connected to provide an output.

4. The integrated circuit of claim 1, wherein said second transistors are N-channel.

5. An integrated high voltage switching circuit, comprising:
   connections for receiving first and second logic supply voltages, as well as a third voltage Which is outside the range of said first and second voltages; and
   first and second circuit arms, each including
      first and second field-effect transistors having mutually opposite conductivity types, and
      third and fourth diode-connected field-effect transistors having mutually opposite conductivity types and interposed in series between said first and second transistors,
      said first, third, fourth, and second transistors being series-connected together between said first and third voltages;
      said first transistors each having a respective source thereof connected to said third voltage, and a respective gate thereof cross-connected to be controlled by said first transistor in the other said arm;
      said second transistors having respective sources thereof operatively connected to said first voltage, and respective gates thereof operatively connected to receive mutually complementary logic signals.

6. The circuit of claim 5, further comprising a load resistance and an isolation transistor jointly series-connected between said third voltage and said second transistor of one said arm, said isolation transistor having a gate connected to a point between said third and fourth transistors of the other said arm.

7. The circuit of claim 5, wherein a drain terminal of one of said second transistors is directly connected to provide an output.

8. The circuit of claim 5, wherein said second transistors are N-channel.

9. The circuit of claim 5, wherein said third and fourth transistors of each said arm have their gates and drains all connected together.

10. An integrated high voltage switching circuit, comprising:
    connections for receiving first and second logic supply voltages, as well as a third voltage which is outside the range of said first and second voltages; and
    first and second circuit arms, each including
        first and second field-effect transistors having mutually opposite conductivity types, and
        third and fourth diode-connected field-effect transistors having mutually opposite conductivity types and interposed in series between said first and second transistors,
        said first, third, fourth, and second transistors being series-connected together between said first and third voltages;
        said first transistors each having a respective source thereof connected to said third voltage, and a respective gate thereof cross-connected to be controlled by said first transistor in the other said arm;
        said second transistors having respective sources thereof operatively connected to said first voltage, and respective gates thereof operatively connected to receive mutually complementary logic signals; and
    a load resistance and an isolation transistor interposed between said third voltage and said second transistor of one said arm, said isolation transistor having a gate connected to a point between said third and fourth transistors of the other said arm.

11. The circuit of claim 10, wherein said isolation transistor has the same conductivity type as said second transistors.

12. The circuit of claim 10, wherein a drain terminal of one of said second transistors is directly connected to provide an output.

13. The circuit of claim 10, wherein said second transistors are N-channel.

14. The circuit of claim 10, wherein said third and fourth transistors of each said arm have their gates and drains all connected together.

15. An integrated circuit comprising:
    a high voltage switching circuit comprising connections for receiving first, second, and third supply voltages, said third voltage being more positive than said second voltage and said second voltage being more positive than said first voltage, and first and second circuit arms each comprising:
        a P-channel field-effect transistor and an N-channel field-effect transistor series-connected together between said third voltage and ground;
        each said P-channel transistor having a respective gate thereof connected to the connection point between said P-channel transistor and N-channel transistor of the other arm;
        said N-channel transistors being connected to receive complementary switching signals at respective gates thereof;
    wherein each said arm of said switching circuit further comprises at least one forward biased protection diode connected between said P-channel and N-channel transistors.

16. The switching circuit of claim 15, wherein said integrated circuit is a floating-gate memory, and said high voltage is a programming voltage $V_{PP}$.

17. The switching circuit of claim 15, wherein the output of said circuit is taken at the connection point between said P-channel transistor and protection diode of one of the arms.

18. The switching circuit of claim, 15, wherein said protection diode is a field-effect transistor having its gate and its drain connected together.

19. The switching circuit of claim 17, wherein an output of said circuit is applied to the gate of a power transistor connected between the high voltage $V_{PP}$ and a load circuit.

20. The switching circuit of claim 15, wherein a resistor is series-connected with an isolation transistor between said third voltage and a first output of said circuit taken at the drain of the N-channel transistor of said first arm, the gate of said isolation transistor being connected to a second output of the circuit taken between said P-channel transistor and said N-channel transistor of said second arm.

21. The switching circuit of claim 15, wherein a resistor is series-connected with an isolation transistor between the ground and a first output of the circuit taken at the drain of said P-channel transistor of said first arm, the gate of said isolation transistor being connected to a second output of the circuit taken between said P-channel transistor and said N-channel transistor of said second arm.

22. The switching circuit of claim 20, wherein a first forward biased diode is series-connected between the drain of said P-channel transistor and said protection diode in said second arm, and wherein said second output is taken at a connection point between said first diode and said protection diode.

23. The switching circuit of claim 22, wherein a second forward biased diode is placed in the first arm symmetrically with respect to said first diode of said second arm.

24. A switching circuit system, comprising:
    two arms each comprising a P-channel insulated-gate field-effect transistor and an N-channel insulated-gate field-effect transistor series-connected between the high voltage and the ground;
    each said P-channel transistor of either said arm having a gate which is operatively connected to be driven by said N-channel transistor of the other said arm;
    means for providing complementary switching signals to respective gate terminals of said N-channel transistors of said two arms;
    means connected to said arms for reducing the stress on respective gate dielectrics of said P and N-channel transistors of each arm.

25. The system of claim 24, wherein said means for reducing stress comprises at least one protection diode that is forward biased and connected between said P-channel transistor and said N-channel transistor.

26. The system of claim 25, further comprising a power transistor connected between the high voltage and a load circuit, and having a gate operatively connected to be driven by an intermediate point of one of said arms.

27. A method of switching an on-chip high voltage, which is outside the limits of logic supply voltages, comprising the steps of:
   (a.) providing a cross-coupled pair of first transistors having sources connected to said high voltage;
   (b.) providing complementary logic signals, referred to first and second supply voltages, to activate only one of a pair of second transistors which are of opposite conductivity type to said first transistors, said second transistors each being separated from a respective one of said first transistors by at least one protection diode; and
   (c.) providing a switched output from a node adjacent to one of said protection diodes.

* * * * *